United States Patent [19]
Rosenblum et al.

[11] Patent Number: 5,527,389
[45] Date of Patent: *Jun. 18, 1996

[54] APPARATUS FOR FORMING DIFFUSION JUNCTIONS IN SOLAR CELL SUBSTRATES

[75] Inventors: Mark D. Rosenblum, Woburn; Jack I. Hanoka, Brookline, both of Mass.

[73] Assignee: ASE Americas, Inc., Billerica, Mass.

[*] Notice: The term of this patent shall not extend beyond the expiration date of Pat. No. 5,270,248.

[21] Appl. No.: 451,718

[22] Filed: May 26, 1995

Related U.S. Application Data

[60] Continuation of Ser. No. 146,613, Oct. 29, 1993, abandoned, which is a division of Ser. No. 926,963, Aug. 7, 1992, Pat. No. 5,270,248.

[51] Int. Cl.$^6$ .................................................. H01L 21/225
[52] U.S. Cl. ............................ 118/58; 118/64; 118/300; 118/324
[58] Field of Search ............................ 118/58, 64, 300, 118/324

[56] References Cited

U.S. PATENT DOCUMENTS

| | | | |
|---|---|---|---|
| 3,789,023 | 1/1974 | Ritchie | 252/218 |
| 3,886,005 | 5/1975 | Cota et al. | 148/188 |
| 4,028,151 | 6/1977 | Lindmayer | 148/189 |
| 4,104,420 | 8/1978 | Jordan et al. | 427/74 |
| 4,152,286 | 4/1979 | Crosson et al. | 252/182 |
| 4,152,824 | 5/1979 | Gonsiorawski | 29/572 |
| 4,153,201 | 5/1979 | Berger et al. | 239/102 |
| 4,251,285 | 2/1981 | Yoldas et al. | 136/256 |
| 4,273,950 | 6/1981 | Chirte | 136/255 |
| 4,301,968 | 11/1981 | Berger et al. | 239/102 |
| 4,337,896 | 7/1982 | Berger et al. | 239/102 |
| 4,352,459 | 10/1982 | Berger et al. | 239/102 |
| 4,359,487 | 11/1982 | Schneider | 427/75 |
| 4,360,393 | 11/1982 | Koval | 148/171 |
| 4,451,969 | 6/1984 | Chaudhuri | 29/572 |
| 4,490,192 | 12/1984 | Gupta et al. | 148/188 |
| 4,541,564 | 9/1985 | Berger et al. | 239/102 |
| 4,704,299 | 11/1987 | Wielonski et al. | 427/38 |
| 4,723,708 | 2/1988 | Berger et al. | 239/102.2 |
| 4,729,962 | 3/1988 | Campbell | 437/2 |
| 4,751,191 | 6/1988 | Gonsiorawski | 437/2 |
| 5,047,131 | 9/1991 | Wolfe et al. | 204/192.23 |

OTHER PUBLICATIONS

Integrated Technologies, Inc., brochure (2 pages) entitled "PM2000 Spray Coating & Drying".
Allied–Signal, Inc., Environmental Data Sheet (6 Sheets) re P–8xxx Series, Phosphorus Spin–On Dopants.
H. L. Berger, "Ultrasonic Nozzles Atomized Without Air", machine Design, 7 pp. Jul. 21, 1988.
Sono–Tek Brochure (5 pages, untitled and undated.
K. S. Tarneja, et al., "Investigation of Liquid Dopants for the production of High Efficiency Solar Cells from Dendritic Web Silicon", Journal Electrochemical society: Solid State Science and Technology, pp. 2438–2441 Oct. 1984.

*Primary Examiner*—Jill Warden
*Assistant Examiner*—Long V. Le
*Attorney, Agent, or Firm*—Pandiscio & Pandiscio

[57] ABSTRACT

Apparatus for forming shallow p-n junctions in silicon substrates to produce photovoltaic cells, which apparatus provides three processing chambers. An ultrasonic spray is mounted in the first processing chamber to coat a front surface of the substrate with a liquid dopant-containing material. The second processing chamber dries the coated substrates leaving a dopant-containing residue on the front surface. The third processing chamber fires the substrates in an oxygen-containing environment to diffuse the dopant into the substrate and provide a p-n junction. The apparatus conducts humidified air to each chamber to control polymerization of the dopant source and to prevent non-humidified air from entering the chambers.

18 Claims, 3 Drawing Sheets

APPARATUS FOR FORMING DIFFUSION JUNCTIONS IN SOLAR CELL SUBSTRATES

This is a continuation of U.S. application Ser. No. 08/146,613, filed Oct. 29, 1993, for "Method And Apparatus For Forming Diffusion Junctions In Solar Cell Substrates", now abandoned, which is a division of U.S. application Ser. No. 07/926,963, filed Aug. 7, 1992, for "Method For Forming Diffusion Junctions In Solar Cell Substrates", now U.S. Pat. No. 5,270,248.

This invention pertains to the manufacture of photovoltaic cells, and more particularly to an improved method for producing photovoltaic junctions by diffusion that offers the advantage of cost savings with no loss of reliability or conversion efficiency.

PRIOR ART

It is well known that attainment of the object of producing commercially-acceptable silicon solar cells with a relatively high efficiency and at a relatively low cost is not expected to occur as a result of a spectacular breakthrough in a single area; rather persons skilled in the art appreciate that the goal of providing economically and technically acceptable photovoltaic solar cells may be achieved as a consequence of the combined effect of a number of what appear to be relatively modest but innovative advances in the art. Thus what may appear to be a relatively small technological advance in a specific area of the photovoltaic cell art may in fact be quite significant from the standpoint of achieving cost savings while permitting the production of relatively high efficiency solar cells.

Currently, and for a number of years preceding the present invention, great efforts have been expended in devising methods of manufacturing solar cells so as to achieve the objectives of (1) relatively high energy conversion efficiency and power output, (2) high production yield, and (3) low cost. Additionally there has been great concern in providing solar cells which are reliable and which do not degrade readily in the operating environment.

One effort directed to the manufacture of relatively low cost silicon cells has involved the production and use of flat polycrystalline silicon substrates grown by the EFG process. Other efforts have involved use of cast polycrystalline substrates, dendritic web silicon substrates, or substrates that are more nearly a single crystal material, e.g., substrates formed by sub-dividing Czochralski-grown boules. In any event, regardless of the source of the substrate, certain steps are required to be carried out in order to convert a silicon substrate into an operative photovoltaic solar cell. In particular, a photovoltaic junction must be formed adjacent one surface of the substrate. In the case of EFG-grown substrates, the substrates are typically of p-type conductivity, preferably being doped with boron so as to have a conductivity in the range of about 2–3 ohm-cm. Accordingly, an n-type dopant, e.g., phosphorus, must be introduced into one side of the substrate in order to form a photovoltaic semiconductor junction.

The formation of junctions in semiconductor substrates by means of a diffusion process is well known. The diffusion process may take various forms. In one case, diffusion may occur from a source material in vapor form, e.g. phosphine. Another process may employ the formation of a solid layer containing the dopant source, and heating the solid layer so as to cause the dopant to diffuse from that layer into the substrate. Still other processes employ so-called "spin-on" materials that are applied as a coating to the substrate, after which the coatings are fired so as to cause the diffusion process to occur.

U.S. Pat. No. 4,451,969, issued Jun. 5, 1984 to Arup R. Chaudhuri for "Method Of Fabricating Solar Cells", U.S. Pat. No. 4,751,191, issued Jun. 14, 1988 to Ronald C. Gonsiorawski et al for "Method Of Fabricating Solar Cells With Silicon Nitride Coating", and U.S. Pat. No. 4,152,824, issued May 8, 1979 to Ronald Gonsiorawski for "Manufacture of Solar Cells", disclose various methods of making semiconductor solar cells wherein a p-n junction is formed by diffusion from a solid or gaseous source. Further information regarding diffusion processes for forming p-n junctions is provided by the references cited in the above-identified patents. Additional information regarding use of gaseous and liquid dopant sources is provided by K. S. Tarneja et al, "Investigation of Liquid Dopants for the Production of High Efficiency Solar Cells from Dendritic Web Silicon", J. Electrochemical Soc., Vol. 131, No. 10, pp. 2438–2441, Oct. 1984.

In the diffused junction manufacturing method described in U.S. Pat. Nos. 4,451,969 and 4,751,191, the junction is formed by exposing the silicon substrate in a diffusion furnace to a continuous flow of a gaseous atmosphere comprising oxygen, nitrogen and a phosphorus source such as phosphine ($PH_3$) at a temperature of about 900° C. for approximately 30 minutes. In the diffusion furnace, a number of reactions occur, but the important reaction is the formation of a phosphosilicate glass represented by the formula $(P_2O_5)_x(SiO_2)_y$. That glass is removed from the ribbon by etching it in a buffered HF acid solution for a period of about two minutes.

Gaseous diffusion processes as described in the above-identified prior art (which typify the diffusion processes used by various companies manufacturing solar cells) offer the disadvantages of relatively high cost and a hazardous toxic environment. Also the diffusion is not confined to just one surface of the substrates, thereby necessitating a subsequent junction isolation step, e.g., as described in U.S. patent application Ser. No. 375,037, filed Jun. 30, 1989, now U.S. Pat. No. 4,989,059, by Ronald H. Micheels et al for "Solar Cell With Trench Through P-N Junction".

Accordingly, in view of the desire to reduce manufacturing costs while improving reliability, efforts have been made to simplify and render more reliable and less costly the junction-forming operation.

OBJECTS OF THE INVENTION

The primary object of the invention is to provide a new method and apparatus for forming p-n junctions by diffusion in silicon substrates.

Another primary object of this invention is to provide a new and improved method of forming photovoltaic junctions by diffusion in silicon substrates, whereby to produce silicon photovoltaic cells.

Still another primary object of this invention is to provide a method and apparatus for diffusing junctions into ribbon-like substrates so that the diffusion is essentially confined to one of the two opposite broad surfaces of the substrate, thereby avoiding the need of a junction isolation step.

A further object of the invention is to provide a novel method and apparatus for forming a p-n junction in a substrate that essentially involves (1) application of a dopant source material in a liquid or semi-liquid form to one surface of the substrate, and (2) heating of the substrate and the source material so as to cause the dopant to be released from the source material and to diffuse into the substrate so as to form a shallow and uniform p-n junction.

A more specific object of the invention is to provide a method of making solar cells using p-type silicon substrates, whereby an $n^+$ type dopant is applied to the substrate in a liquid vehicle, and the liquid vehicle is thereafter fired so as to cause the dopant to diffuse into the substrate and form a shallow p-n junction.

Another more specific object of the invention is to provide a method of forming solar cells using EFG-type polycrystalline substrates wherein a liquid dopant source material containing a predetermined dopant is sprayed onto one side of the substrate as a thin and uniform coating, and thereafter the substrate and the liquid source material are fired so as to cause the dopant to be diffused into the substrate and thereby form a p-n junction.

Still another specific object of the invention is to provide novel apparatus for applying a liquid dopant source material to a substrate in preparation for formation of a junction by diffusion.

Another specific object of this invention is to provide a method of manufacturing solar cells involving the formation of photovoltaic junctions in pre-formed substrates by a diffusion doping process wherein a dopant source material is applied to one side of the substrates by a spray apparatus, and the substrates are supported on a liquid-absorbent conveyor web or belt during application of the dopant source material, so as to prevent dopant source material from coating the rear sides of the substrates.

The foregoing objects, plus other objects hereinafter described or rendered obvious, are achieved by a method and apparatus which may be generally characterized as follows: (1) a flat, ribbon-type silicon substrate is sprayed with a thin, uniform coating of a source material containing a selected dopant, (2) the coated substrate is then passed through a drying stage wherein the liquid source material is dried; and (3) thereafter the substrate is subjected to firing in a diffusion furnace in an oxygen-containing environment under conditions calculated to cause the dopant in the source material to diffuse into the substrate so as to form a shallow p-n junction. A liquid spray apparatus is used to apply the liquid source material as a fine spray-like mist. In the preferred embodiment of the invention, the substrates are transported on a liquid-absorbing conveyor past the spray apparatus, and the spray apparatus comprises an ultrasonic spray head mounted above the conveyor by means adapted to reciprocate the spray head transversely to the path of movement of the substrates on the conveyor, whereby to cause the liquid source material to be applied in a reciprocating spray pattern, with the reciprocating speed of the spray head and the linear motion speed of the conveyor being set so that each line of liquid discharged by the spray head will overlap a previously deposited line of liquid and thereby form a continuous coating on the substrate. That coating is subsequently fired so as to cause the diffusion process to occur. By appropriately selecting the source material and the operating conditions, it is possible to obtain a relatively uniform shallow junction in p-type silicon material where the junction has a depth of approximately 0.5 microns.

Other advantages and features of the invention are described or rendered obvious by the following detailed specification of the invention which is to be considered together with the accompanying drawings.

THE DRAWINGS

FIGS. 1A–1E illustrate some of the steps involved in making solar cell p-n junctions according to this invention;

In the drawings, for convenience of description and illustration, the thicknesses and depths of the substrates and the several coatings and doped regions, and the mechanical parts are not shown exactly in accordance with their true relative positions and proportions.

DETAILED DESCRIPTION OF THE INVENTION

This invention is directed to providing a high performance junction formation technique calculated to reduce the cost of producing relatively high efficiency, reliable silicon photovoltaic cells and related devices.

Prior to this invention, it has been known that dopant diffusion in a semiconductor device may be accomplished by applying a liquid source material to a substrate in various ways, e.g, by spin-on and spraying techniques. However, in relation to the manufacture of solar cells, the concept of spraying a diffusion source onto a silicon substrate is subject to a number of significant considerations, including the need to have a shallow as well as a uniform junction, and also the need to avoid the formation of a junction on the rear side of the solar cell.

The present invention is particularly, but not necessarily, adapted for a cell-processing method wherein p-type silicon EFG substrates are processed to form shallow p-n junctions. The formation of the p-n junction involves the introduction of a dopant such as phosphorus so as to produce an $n^+$ region at one side of the substrates.

While the idea of spraying a liquid dopant diffusion source onto a semiconductor substrate is well known, heretofore it has not been known how to utilize that approach so as to produce in each of a series of pre-formed silicon substrates a shallow and uniform photovoltaic junction, and to do so using mass production methods so as to obtain relatively high efficiency solar cells at reduced cost. In particular, one area of concern in relation to the diffusion junction-formation problem has been the desire, for reasons of costs and the like, to avoid the formation of a junction on the rear side of the solar cell. The creation of a junction on the rear side of the solar cell is undesirable since it necessitates a junction isolation step in the overall manufacturing process. U.S. patent application Ser. No. 375,037, now U.S. Pat. No. 4,989,059 supra, discloses the concept of using a laser to accomplish junction isolation in the case where the front side diffusion is accompanied by diffusion on the rear side of the substrate.

The present invention requires that a (1) liquid or semi-liquid dopant source be applied onto a series of substrates as a thin, uniform coating, and (2) that coating be heat-treated so as to cause formation of uniform and shallow p-n junctions in the substrates. In the preferred mode of practicing this invention, the liquid dopant is applied by mechanically manipulated ultrasonic means designed to assure that the dopant liquid is applied in a uniform layer, whereby to assure the formation of a p-n junction having a uniform depth and quality with a low dopant consumption.

Applicants preferably make use of an unpressurized atomizing process generally similar to the kind described by Harvey L. Berger, "Ultrasonic Nozzles Atomize Without Air", Machine Design, Jul. 21, 1988. However, the spraying technique described in said publication is not related to the formation of solar cells in accordance with this invention.

Referring now to FIGS. 1A–1E, according to the preferred embodiment of the invention, silicon wafers or substrates in the form of flat ribbons 2 are processed to form photovoltaic solar cells. Each substrate 2 has broad oppositely disposed front and back surfaces 4 and 6. Each substrate 2 is p-type silicon material, preferably constituting a substrate grown by the EFG process and doped with boron to a conductivity in the range of 2–3 ohm-cm.

Figure 1A:
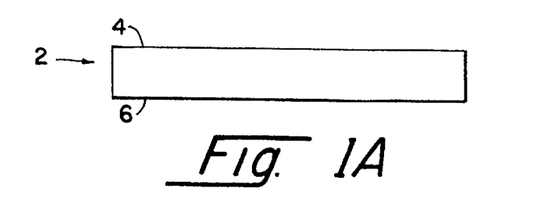
Figure 1B:
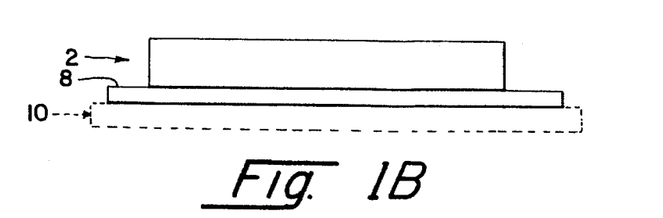

Each substrate 2 is disposed on a liquid-absorbent belt or web 8 which may itself act as a conveyor or which may be supported on or form part of a separate conveyor belt as shown in phantom at 10. Preferably belt 8 is made of paper or cloth, or a plastic-backed paper or cloth web, e.g., a polyethylene-coated paper web, and used without a separate conveyor belt 10 for reasons of economy and quality control. A plurality of substrates 2 are disposed in series on web 8, with the web having a width which is greater than the corresponding width of the substrates 2, as shown in FIG. 1B. It is preferred that belt 8 have a width great enough to accommodate several, e.g., 1–5, substrates disposed side by side. However, for simplicity of illustration and description, the invention is described on the assumption that a single row of substrates is disposed on web 8. The several substrates disposed in series on the web 8 are passed beneath a spray head mechanism which functions to apply a thin coating 12 (FIG. 1C) of a liquid dopant source to the upper side 4 of the substrate 2. The liquid dopant source material is applied in a uniform and very thin layer, and then dried.

Thereafter, the substrates are transferred, e.g., via another conveyor 14 (FIG. 1D), to one or more additional process stages where they are subjected to an organics-burnoff and also a firing step, so as to cause the formation of an $n^+$ region 16 extending down from the upper surface of the substrate a distance of about 0.5 microns, so as to form a p-n junction 18. The firing causes a residual silicate glass-like layer 20 to be formed on the upper surface of the substrate. That glass-like layer is removed by a conventional HF etching treatment, thereby leaving the substrate with a relatively clean upper surface 4 (FIG. 1E). Also the rear or lower surface 6 has no significant $n^+$ region formed therein.

Figure 1C:
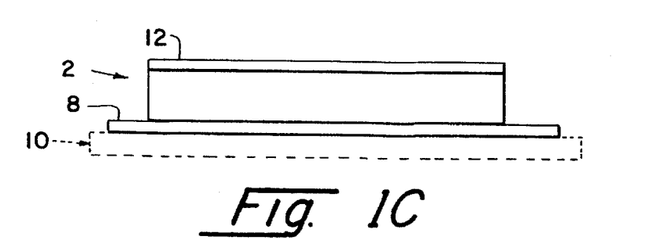

In the above-described process, the liquid coating 12 is applied so as to cover substantially the entire top surface 4 of the substrate, with the spray head mechanism being designed and operated so that little dopant source material is sprayed directly on web 8, but in any event little or no liquid dopant source material reaches the rear side 6 of the substrate by a diffusion or wicking action, due to the absorbent nature of web 8.

Figure 2:
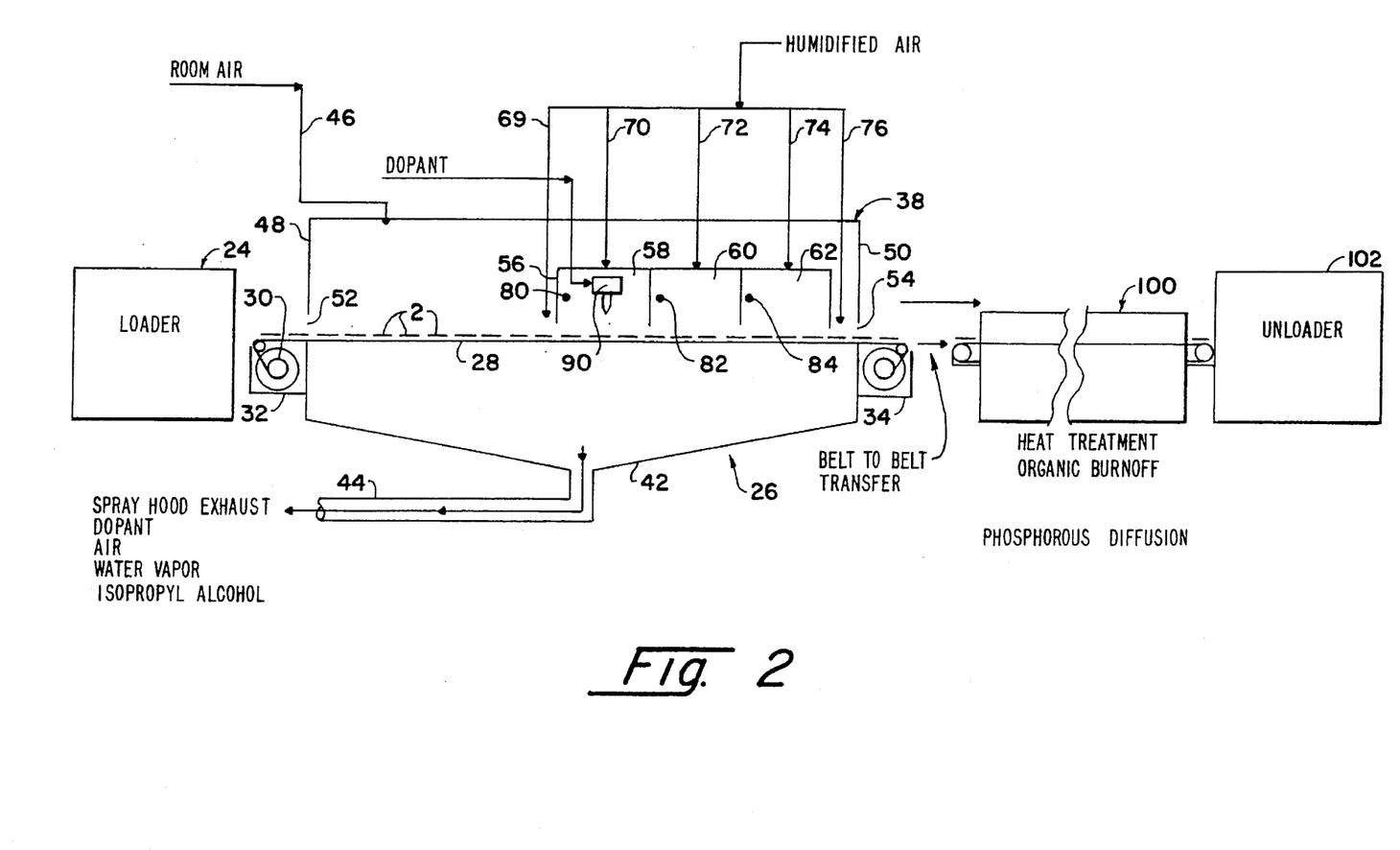
FIG. 2 is a schematic view in side elevation illustrating the apparatus and method for forming diffused junctions and solar cells according to this invention.

Referring now to FIG. 2, the invention is preferably practiced by apparatus that comprises a loader mechanism or stage 24 that is adapted to load a plurality of substrates 2, e.g., p-type silicon substrates, onto the conveyor of a selected liquid spray apparatus identified generally at 26. The latter comprises support means 28 for supporting a conveyor belt in the form of a paper web 30 that is fed by a web-feeding spool 32 and is taken up by a web-winding or take-up mechanism 34. Web 30 has a speed in the range of 5–100 inches per minute, preferably about 10–50 inches per minute.

Spray apparatus 26 also comprises a hood 38 that envelops the web 30 and silicon substrates 2 carried by that web, as well as other means hereinafter described. Hood 38 has a bottom manifold 42 with a discharge port 44 that is connected to a source of suction (not shown) so as to effect removal of air, undeposited dopant material, water vapor and the evaporated organic solvent constituents of the liquid dopant source material that is sprayed onto the substrates. The front and rear walls 48 and 50 of hood 38 have openings or windows 52 and 54 through which the conveyor 30 and the substrates carried thereby may pass into and out of the hood. Hood 38 comprises wall means 56 that define a spray chamber 58, a drying chamber 60, and a drying tunnel 62. Room air, i.e., air at room temperature and humidity, is fed into the front end of hood 38 via a line 46. The region in hood 38 immediately upstream of spray chamber 58, drying chamber 60, drying tunnel 62 and the region in hood 38 immediately downstream of drying tunnel 62 are supplied with humidified air at a temperature preferably in the range of 65–85 degrees F., i.e., air with controlled humidity, via lines 69, 70, 72, 74 and 76 respectively. In accordance with this invention, the humidity to which the substrates are subjected in chambers 58 and 60 and drying tunnel 62 is controlled, with such control being effected by use of humidity sensors represented schematically at 80, 82 and 84 that are positioned to sense the relative humidity in chambers 58 and 60 and drying tunnel 62 and provide control signals to control means (not shown) that control the flow of humidified air in lines 70, 72 and 74. The relative humidity of the air in chambers 58 and 60 is kept in the range of 25 to 45%, while the relative humidity in tunnel 62 is kept in the range of 25 to 60%. Controlling humidity of the air in chambers 58 and 60 and tunnel 62 is critical in controlling the polymerization of the preferred dopant source which is hereinafter described. When the preferred dopant source is exposed to moisture in the air fed to chambers 58 and 60 and tunnel 62, further polymerization occurs. The rate of flow of humidified air in lines 69 and 76 is slightly greater than the rate of flow of humidified air in lines 70, 72 and 74, so as to cause the pressure in the region fed by lines 69 and 76 to exceed the pressure in chambers 58 and 60 and tunnel 62 only slightly, e.g., by less than 1 inch of water, thereby helping to prevent non-humidified air, i.e., room air, from flowing into chambers 58 and 60 and tunnel 62, without disturbing the uniformity of the spray described below.

Located in spray chamber 58 is an ultrasonic spray head 90 that is adapted to be reciprocated transversely of the longitudinal axis of the belt. In the spray chamber, a liquid spray dopant source is sprayed onto the substrates at room or near-room temperature, i.e., 65–85 degrees F., at a rate and with a dispensing pattern calculated to cause a uniform coating 12 (FIG. 1C) of the dopant source to be deposited onto the front surface of the substrates, with a minimum of overlap of the spray stream onto web 8. In the drying chamber 60 and drying tunnel 62 the liquid spray diffusion source material is dried at a temperature that is preferably in the range of 65–85 degrees F., following which the substrates are conveyed out of spray apparatus 26 for subsequent organic burnoff and diffusion treatments which preferably are conducted in separate areas of an elongate infrared furnace 100 of the type having a belt conveyor for transporting the substrates through the furnace chamber(s). In the organic burnoff heat treatment stage of furnace 100, the substrates are heated in air to a temperature that is preferably in the range of 300–500 degrees C. so as to cause complete removal of residual organic constituents of the dopant source liquid by evaporation and combustion. In the diffusion stage of furnace 100, the substrates are fired in an air or oxygen atmosphere to a temperature in the range of 880 to 950 degrees C., whereby phosphorus in the dopant source material is caused to diffuse into the substrates and to form the n+ region 16 and junction 18 illustrated in FIGS. 1A–1E. Use of the infra-red furnace offers the advantage of reducing the diffusion firing time for the desired junction depth. The substrates are removed from furnace 100 by a suitable unloading mechanism 102, after which the substrates are subjected to etching as described above to remove any glass-like silicate (or phosphosilicate) residue remaining on front surfaces 4 of the substrates.

Figure 3:
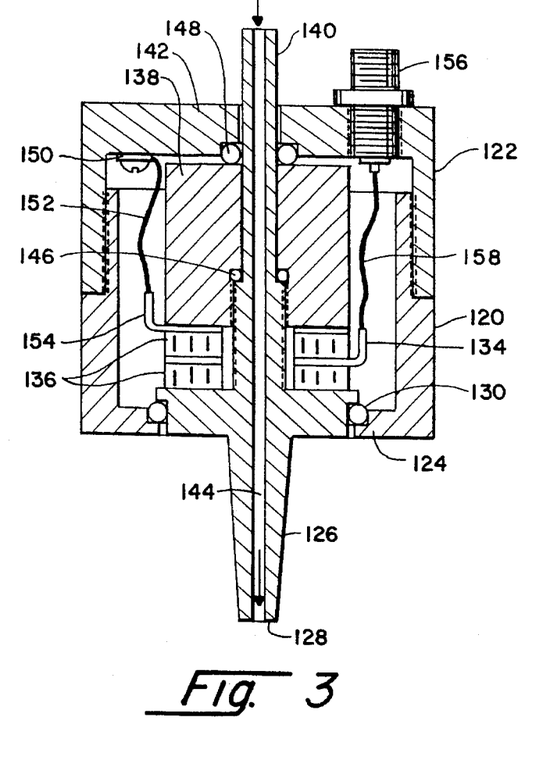
FIG. 3 is an enlarged schematic cross-sectional view in front elevation of the spray head used in practicing the present invention.

FIG. 3 illustrates a preferred form of ultrasonic spray head used in the practice of the invention. Ultrasonic spray heads are well known, as exemplified by U.S. Pat. Nos. 4,723,708, 4,153,201, 4,337,896, and 4,301,968 and the Berger article, supra. More specifically, the device illustrated in FIG. 3 comprises a shroud or housing in the form of a front shroud or housing member 120 and a rear shroud or housing member 122 which are screwed together. Front shroud 120 has an end wall 124 in which is disposed a hollow conically-shaped atomizing horn or nozzle 126 with a "micro-spray" tip 128 as illustrated and described in the Berger article, supra. An O-ring 130 is disposed between end wall 124 and horn 126. The spray head comprises an ultrasonic driver in the form of an annular metal electrode 134 disposed between a pair of annular piezoelectric disks 136. The latter are mounted in coaxial but radially-shaped relation with a threaded central tubular extension 138 of atomizing horn 126 that is screwed into a rear horn or dummy section 140. Rear horn section 140 extends through extension 138 and also through rear wall 142 of the rear shroud 122. Horn 126 and rear horn section 140 have a common central bore 144 that functions as a feed passageway for the liquid dopant source material. O-rings 146 and 148 are disposed respectively between horn section 126 and extension 138, and between rear end wall 142 and extension 138.

The rear shroud has a ground terminal 150 which is connected by a suitable wire lead 152 to a ground electrode 154 located on one side of the piezoelectric assembly. Additionally an electrical connector 156 is mounted in the rear wall 142 and is coupled by a conductive wire 158 to the front electrode 134.

The device illustrated in FIG. 3 is designed to provide a transverse mode of vibration, i.e., the energization of the piezoelectric crystals causes the front and rear horns to vibrate transversely to the longitudinal axis of the device. The rear end of extension 138 is connected via a hose or other conduit (not shown) to a supply of liquid dopant source material (also not shown). The liquid dopant source material is fed to the spray head under atmospheric or near-atmospheric pressure by gravity or a suitable low-pressure positive displacement-type metering pump (not shown) that preferably requires no air to deliver the liquid dopant material. If a pump is used, its output pressure preferably should not exceed about 16–20 psi. Preferably, but not necessarily, an ultrasonic spray head of the type manufactured by Sono-Tek of Poughkeepsie, N.Y. is used. In this connection, it should be noted that the spray head shown in FIG. 3 is generally the same as the devices shown in U.S. Pat. No. 4,723,708 and the aforesaid article by Berger. By way of example but not limitation, the ultrasonic spray head 90 may be a Sono-Tek Model 8700-120 spray head that operates at a frequency of about 48 kHz, while a Model 909 syringe-type pump made by Harvard Apparatus Corp. of South Natick, Mass., may be used to supply dopant source material to the spray head. The central bore 144 in the nozzle preferably has a diameter at its discharge end in the range of about 0.015 to about 0.030 inch, preferably about 0.020 inch, whereby ultra-fine micron-size drops are discharged in a "soft" low velocity spray or fog.

Figure 4:
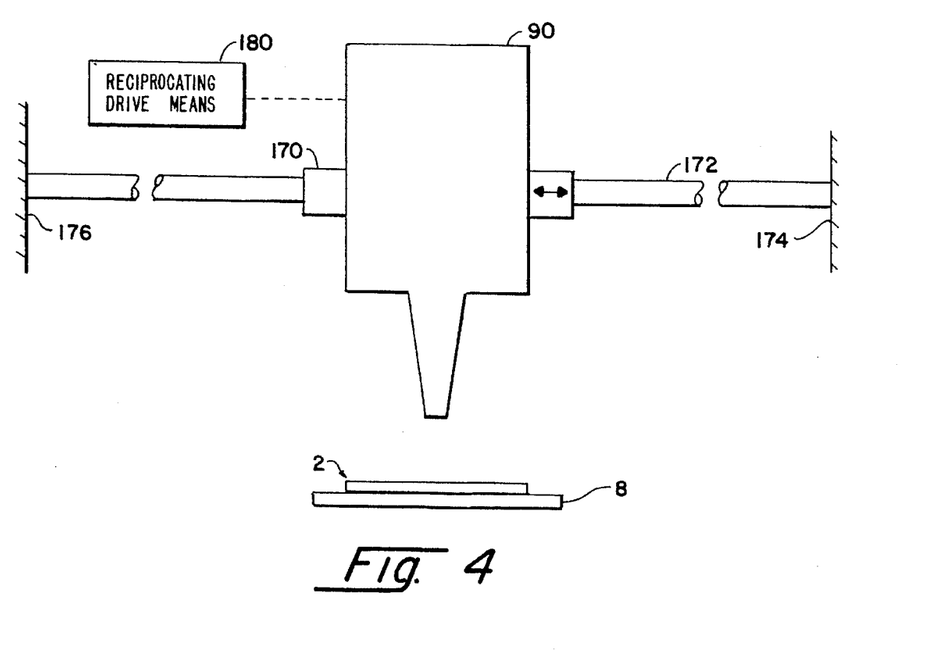
FIG. 4 is an enlarged schematic view illustrating how the ultrasonic spray head is mounted for reciprocation above the substrates.

Referring now to FIG. 4, ultrasonic spray head 90 is mounted for reciprocation transversely of the longitudinal axis and path of movement of the paper web. By way of example, but not limitation, the ultrasonic spray head is mounted to a carriage 170 that is mounted for reciprocation on one or more slide rods 172 that are anchored to suitable fixed supports 174, 176 and extend horizontally over the belt. A suitable drive means represented schematically at 180 is used to reciprocate the ultrasonic nozzle at a selected rate, preferably about 48 complete strokes (back and forth) per minute.

Various liquid dopant source materials may be used in the practice of this invention. By way of example but not limitation, the liquid dopant source may comprise a phosphorus spin-on dopant such as one of the spin-on dopants sold by Allied-Signal Inc., Milpitas, Calif., under the designations P-8, P-8540 and P-8545. These particular spin-on materials comprise a phosphosilicate polymer in an alcohol/ester solution. The phosphosilicate polymer is represented by the following formula:

$[SiO_a(OC_2H_5)_b(OH)_c(OP)_d]_n,$ where $a \geq 1$, b and $c \leq 0.5$, $d \leq 1.0$, and $n=5–100$, with the molecular weight of the polymer being in the range of 500 to 10,000. The alcohol ester solution comprises a mixture of ethanol, isopropyl alcohol, n-propyl alcohol, and ethyl acetate. The P-8545 material is preferred. That material is believed to comprise by weight approximately 4.9% phosphosilicate polymer, 2% ethanol, 36% isopropyl alcohol, 12% ethyl acetate, and 45% propyl alcohol. For this invention, it is preferred that said material be diluted so as to provide a dopant-to-solvent ratio by volume that facilitates the proper spray diffusion pattern and assures formation of a uniform layer of dopant source material on the substrates. By way of example, the P-8545 material is diluted by increasing the concentrations of ethanol, isopropyl alcohol, n-propyl alcohol and ethyl acetate by about 50% by volume. When the phosphosilicate polymer is deposited and dried in chambers 58 and 60 and tunnel 62, further polymerization occurs, with the extent of polymerization being dependent in part on the humidity and air flow in those chambers and tunnel.

The use of a paper web or belt is required for the purpose of substantially preventing any of the sprayed liquid source material from migrating onto the rear side of the substrates disposed on the belt. The ultrasonic spray head 90 is reciprocated by drive means 180 so that its nozzle passes slightly beyond the opposite edges of the substrates as it reaches first one end and then the other end of its operating stroke. Preferably movement of the ultrasonic spray head is such that it extends beyond each opposite edge of the substrates by about 0.5 to 1.0 inch, thereby avoiding any undesired concentration of dopant material where the spray head reverses its direction of movement relative to web 30.

Notwithstanding the absorption of excess dopant liquid by paper web 8, it has been determined that a relatively small amount of the source material may bleed via web 8 over to the rear surfaces of the substrates by a distance not exceeding about 0.030 inch inwardly of one or both side edges of the substrates, generally not more than about 0.010 to about 0.015 inch. However, the pickup of dopant source material is subject to a gradient phenomenon, so that the concentration of phosphorus picked up by the rear surface of the substrate decreases sharply with increasing distance from the side edge of the substrate. Accordingly, the concentration of phosphorus that will diffuse into the rear sides of the substrates during the diffusion heat treatment will be quite low, so that at worst only a very high resistance and negligible short-circuit can result. Therefore, no junction isolation treatment is required.

In this connection, it is to be appreciated that the manufacture of silicon solar cells typically involves the application of a thin layer of aluminum on the rear side of the substrates, with the aluminum functioning as the rear contact for the solar cells. Preferably, but not necessarily, the application of the aluminum layer on the rear side of the substrate is controlled so that the aluminum layer terminates about 0.050 inches from the edges of the substrate, thereby further minimizing the effect of any overlap and absorption of liquid source material on the rear side of the substrates and thereby further avoiding the need for any subsequent junction isolation procedure.

As noted above, the paper web or belt 8 limits weeping of the source material onto the rear side of the substrates. Accordingly, it is to be appreciated that paper web 8 may be made of another material, e.g., a web made of a cloth material such as cotton, which is capable of absorbing but is also resistant to the source material. An aspect of the invention is that the paper web 8 or 30 is not subjected to high temperatures, thereby avoiding possible deterioration or combustion of that web or belt.

In drying chamber 60 and drying tunnel 62 the major fraction of the volatile organic components of the liquid source material are evaporated. Any residual organic material on the substrates is burned off and thus removed from the system in the subsequent organic burn-off treatment which (as noted above) may or may not be incorporated in the same appparatus in which the phosphorus diffusion is accomplished. Preferably, the heat treatment that removes residual organic material is conducted at a temperature of about 300 to 500 degrees C. for a period of about 3.0 minutes, and that treatment may be accomplished in a continuous furnace having a first stage for the aforesaid heat treatment, plus at least a second stage for the phosphorus diffusion. In the second stage, i.e., in the phosphorus diffusion firing stage, the substrates are fired at a temperature in the range of about 880 to about 950 degrees C., preferably a temperature of about 890 degrees C., for about 5–20 minutes.

The ultrasonic spray head is designed to apply the dopant source material at a rate in the range of 0.3 to 5.0 ml/per minute, so that under the preferred operating conditions, the liquid source material is applied in a thickness in the range of about 1000 to 2000 Angstrom units. After the foregoing coatings have been dried and fired, they will have a thickness of approximately 1000 Angstroms or less.

Following is an example of how to practice the invention using apparatus as shown in FIGS. 2–4.

EXAMPLE

P-type silicon substrates, preferably constituting substrates produced by the EFG crystal growth method, are loaded one at a time onto the paper web conveyor 30 by the loader mechanism 24. The substrates are flat rectangular wafers measuring approximately 4 by 4 inches, and have a thickness of approximately 0.015 inch. The substrates also have a resistivity in the range of 2–3 ohm-cm. The paper web 30 is operated at a speed of approximately 10 inches per minute. Air at room temperature and humidity conditions, i.e., 25 degrees C. and 30% relative humidity, is injected into the apparatus via line 46 at a rate of approximately 800 SCFM. Humidified air is injected into chambers 58, 60 and drying tunnel 62, as well as into the area immediately preceding chamber 58 and the area immediately following chamber 62, via lines 69, 70, 72 and 74 and 76. The humidified air has a relative humidity of 25–60% and a temperature in the range of 65–85 degrees F. That humidified air is injected into lines 69, 70, 72, 74 and 76 at respective rates of 0.1–100 SCFH, 0.1–10 SCFH, 0.1–10 SCFH, 0.1–10 SCFH, and 0.1–100 SCFH, with the air being fed into lines 69 and 76 at a higher rate than it is fed into lines 70, 72 and 74, so as to minimize infiltration of room air into chambers 58 and 60 and tunnel 62. No heat is supplied to the hood 38, and whatever materials are evaporated are removed from the hood via the line 44.

A liquid dopant material in the form of Allied-Signal material P-8545, diluted by increasing the concentrations of ethanol, isopropyl alcohol, n-propyl alcohol and ethyl acetate by 50% by volume is dispensed by spray nozzle 90 at a rate in the range of 0.3 to 0.5 ml/per minute, with the ultrasonic spray head being operated at a frequency of 48 kHz. The discharge orifice of the spray nozzle measures about 0.020 inch in diameter, and the spray head is reciprocated back and forth at a rate of 48 complete (back and forth) strokes per minute, with the tip of the nozzle surface 128 being spaced approximately ⅛ to ¼ inch inch from the upper surface of the substrates disposed on web 30.

As a result of the foregoing conditions, a uniform continuous coating of the liquid dopant source material is applied to the substrates in a thickness ranging between about 0.1 and 0.2 microns. The spray from the nozzle has a narrow dispersion pattern not exceeding about ⅛ inch wide that tends to spread on the wafer to a width of about ¼–½ inch, and that pattern combined with the selected conveyor speed assures that each "line" of liquid sprayed onto each substrate overlaps or otherwise melds with each preceding and succeeding line of liquid. The wafers passing out of chamber 58 are subjected to a preliminary drying operation in chamber 60 and then to a further drying operation in tunnel 62.

The humidity sensors 80, 82 and 84 sense the humidity in the chambers 58, 60 and 62 and cause a control mechanism (not shown) to adjust the rates of flow of humidified air into the lines 70, 72, 74 and 76 so that the humidity is maintained as follows: in chamber 58, 25–45% RH; in chamber 60, 25–45% RH; and in chamber 62, 25–60% RH.

Figure 1D:
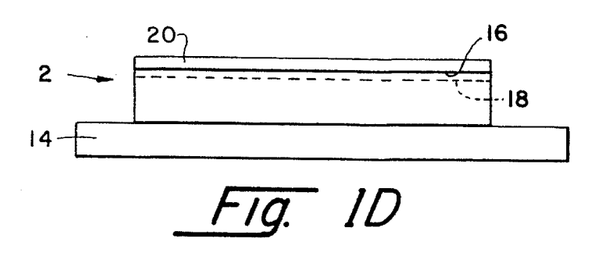

The wafers pass out of the spray hood apparatus into a heat treatment and diffusion furnace 100. They travel through the furnace at a rate of about 10 inches/minute. The furnace comprises a first organics burn-off stage and a second phosphorus diffusion stage. In the first organic burn-off stage, the substrates are subjected to an air or oxygen environment at a temperature in the range of 300–450 degrees C. for a period of approximately 3 minutes, whereby complete removal of the residual organic constituents of the dopant source liquid is achieved by further evaporation and combustion. The furnace is operated so that the temperature in its diffusion stage is about 890 degrees C., with an air or oxygen atmosphere being present in that stage. The duration of the substrates in the diffusion stage at the temperature of about 890 degrees C. is approximately 10 minutes, whereby phosphorus from the liquid dopant source layer is caused to diffuse into the substrates and to form the $n^+$ region 16 and the junction 18 as mentioned previously, with the junction being about 0.5 microns below surface 4.

The substrates are removed from the furnace by unloader 102 and are passed to an etching stage where they are subjected to a buffered hydrogen fluoride (HF/NH$_4$) etching bath long enough to remove glass-like silicate (or phosphosilicate) residue remaining on the front surfaces 4 of the substrates.

Substrates treated according to the foregoing example offer the advantage that a relatively uniform n$^+$ region 16 is formed, so that the junction 18 has an essentially uniform depth across the substrates. The substrates resulting from the process offer the advantage that there is little or no phosphorus diffusion evident on the rear sides of the substrates. Whatever phosphorus diffusion occurs is subject to a sharply decreasing gradient, so that little or no phosphorus dopant presence is evidenced on the rear surfaces at a distance of approximately 0.030 inch inboard of the side edges of the substrates. Hence there is no need to subject the substrates to a junction isolation procedure.

Following the etching procedure, the substrates are subjected to an aluminumization treatment so as to cause the formation of an aluminum electrode on the rear side of the substrates. The aluminum electrodes are formed so that they are spaced a distance approximately 0.050 inches inboard of the side edges of the substrates, thereby further avoiding any need for junction isolation treatment since there is virtually no short-circuiting of the junction. The aluminum electrodes may be formed in various ways known to the art, e.g., as described in U.S. Pat. Nos. 4,451,969 and 4,751,191, except that (as noted above) it is preferred that the aluminum electrodes be spaced from the side edges of the substrate.

It is to be appreciated that it may be possible for some solar cell manufacturing processes to use an air brush-type spray head, or possibly some other type of spray head in place of the ultrasonic spray head herein described and illustrated. However, an ultrasonic spray head is preferred since it offers the advantage of providing a relatively "soft" unpressurized spray, whereby the spray may be confined to a very narrow area. In this connection it is to be noted that if the nozzle opening 144 has a diameter not exceeding about 0.030 inch, preferably about 0.020 inch, the spray which is discharged by the ultrasonic head, not only is a low velocity "soft spray", but in addition it has a relatively narrow and uniform dispersion pattern and offers the advantage that it is not air-borne.

The foregoing invention offers a number of advantages. First of all, the low velocity of the dopant source stream ejected by the ultrasonic nozzle tends to avoid any physical disturbance of the blanks on the paper web 8 (or 30). An air brush has been used in place of the ultrasonic nozzle for the purpose of spraying liquid dopant source material on the substrates, but it was found that the relatively higher velocity of the air stream injected by the air brush may cause movement of the substrates on the web, which in turn tends to result in an increase in the amount of liquid dopant source deposited on the back side of the substrate. It is appreciated that an air brush may be suitable for applying liquid dopant source material in the case where the substrates are relatively flat, e.g., Czochralski substrates, but it is preferred to use an ultrasonic spray head where the substrates are EFG material, since EFG substrates tend to have an irregular surface, and that irregular surface tends to increase the likelihood of disturbance of the substrates on the web by air currents, thus increasing the possibility of migration of source material onto the rear sides of the substrates.

It is to be noted that the degree of polymerization of the preferred dopant material is a function of the humidity to which the liquid dopant source material is exposed in the spray apparatus, and the degree of polymerization in turn affects the etching quality of the glass-like residue remaining on the substrates after the diffusion firing procedure, as well as the uniformity and depth of the phosphorus diffusion.

Obviously other liquid dopant sources known to persons skilled in the art may be used in the practice of this invention, e.g., water-based phosphorus dopant sources. It is to be appreciated also that other process conditions may be varied. Thus, for example, the web speed may be changed, the spray head may be operated at a different frequency, the rate of reciprocation of the spray head may be changed, and the rate of feeding of the liquid dopant source and the thickness of the layer of that source deposited on the substrates by the spray head also may be varied.

It also is contemplated that more than one reciprocating spray head may be used, and also that the single reciprocating spray head shown in the drawings could be replaced by a plurality of fixed spray heads arranged so as to apply a uniform coating of the liquid source material over the full expanse of the top surfaces of the substrates on the web.

Still other modifications will be obvious to persons skilled in the art.

A key advantage of the invention is that it reduces costs by an economical minimum use of dopant source material which is relatively expensive. Furthermore, use of a low velocity, relative low flow rate spray apparatus for dispensing the liquid dopant material onto the substrates leads to a reduction in the amount of wraparound that occurs, i.e., less dopant is absorbed by the rear surface of the substrates. Still other advantages will be obvious to persons skilled in the art.

What is claimed is:

1. Apparatus for forming shallow p-n junctions in silicon substrates so as to produce silicon photovoltaic cells, each substrate being of a first conductivity type and having a front surface and a back surface, said apparatus comprising:

(a) walls defining a first housing;

(b) conveyor means movable through said first housing for supporting said substrates on said back surfaces;

(c) an ultrasonic spray device disposed in said first housing for spray coating said front surfaces of each of said substrates with a continuous, substantially uniform layer of a liquid source material having as a constituent a dopant of a second, opposite conductivity type, said ultrasonic spray device being adapted to atomize said liquid source material without the use of pressurized gas and to spray said liquid source material onto said front surfaces of each of said substrates in the form of substantially micron-sized droplets;

(d) firing means disposed in a second housing for heating said substrates at a temperature and for a time sufficient to cause diffusion of said dopant constituent of said liquid source material into said front surfaces of said substrates so as to form p-n junctions at substantially uniform depths relative to said front surfaces of each of said substrates;

(e) moisturizing air conduit means in communication with said first housing for admitting moisturized air thereinto; and (f) first humidity sensor means disposed in said first housing for providing signals to a control means for control of flow of moisturizing air through said conduit means to said first housing proximate said spray device to maintain relative humidity in said first housing proximate said spray device in a selected range.

2. The apparatus according to claim 1 wherein said ultrasonic spray device includes a nozzle having a distal end defining a discharge orifice, wherein said apparatus further comprises a first processing chamber in said first housing and having therein at least said nozzle of said ultrasonic spray device and adapted to contain said substrates as they are sprayed with said liquid source material, wherein said air conduit means comprises means for providing humidified air to said first processing chamber, and wherein said first humidity sensor means is disposed in said first processing chamber for sensing the humidity and controlling the relative humidity in said first processing chamber.

3. The apparatus according to claim 2 wherein said discharge orifice has a diameter between about 0.015 inch and about 0.030 inch.

4. The apparatus according to claim 2 further comprising a second processing chamber in said first housing adjacent said first processing chamber, said second processing chamber being adapted to receive coated substrates from said first processing chamber, said second processing chamber comprising drying chamber means for drying said substrates so as to dry said liquid source material thereon, said air conduit means comprising means for providing humidified air to said second processing chamber, and said apparatus further comprising second means for sensing humidity and controlling the relative humidity in said second processing chamber.

5. The apparatus according to claim 4 further comprising a third processing chamber in said first housing adjacent said second processing chamber, said third processing chamber being adapted to receive said substrates from said second processing chamber, said third processing chamber comprising a second drying chamber means and including means for further drying said substrates, said further drying means comprising a portion of said air conduit means for providing humidified air to said third processing chamber, and said apparatus further comprising third means for sensing humidity and controlling relative humidity in said third processing chamber.

6. The apparatus according to claim 4 wherein said conveyor means comprises a first conveyor defining a first substantially horizontal support surface below said distal end of said nozzle of said ultrasonic spray device, said first support surface extending through said first processing chamber and said second processing chamber, said first conveyor being adapted to sequentially deliver said substrates to said first and second processing chambers and to support said substrates on said back surfaces thereof during the spray coating and drying of said liquid source material on said front surfaces thereof.

7. The apparatus according to claim 6 wherein said first conveyor comprises a web of material capable of absorbing excess liquid source material from said ultrasonic spray device not utilized in formation of said layers on said front surfaces of said substrates.

8. The apparatus according to claim 7 wherein said web is made of a material selected from a group consisting of paper and cloth.

9. The apparatus according to claim 6 wherein said conveyor means further comprises a second conveyor adapted to receive said substrates from said first conveyor and to transport said substrates through said second housing.

10. The apparatus according claim 6 wherein said distal end of said nozzle of said ultrasonic spray device is adapted to be reciprocated transversely relative to the direction of movement of said first conveyor.

11. The apparatus according to claim 6 wherein said first conveyor is adapted to be operated at a speed in a range between about 5 inches per minute and about 100 inches per minute, and wherein said distal end of said nozzle of said ultrasonic spray device is adapted to be reciprocated transversely across said substrates at a rate of about 48 cycles per minute.

12. The apparatus according to claim 1 wherein said ultrasonic spray device is adapted to be operated at a frequency of about 48 kHz, such that said liquid source material is emitted from said discharge orifice at a rate of between about 0.3 ml per minute and about 0.5 ml per minute.

13. The apparatus according to claim 2 wherein said discharge orifice of said nozzle of said ultrasonic spray device is adapted to emit a substantially conical pattern of micron-sized droplets of said liquid source material, said conical pattern having a maximum diameter of about 0.125 inches at a distance of about 0.25 inches from said nozzle, and said distal end of said nozzle is adapted to be reciprocated in a substantially horizontal plane located between about 0.25 inches and about 0.125 inches above said front surfaces of said substrates resting on said first conveyor.

14. Apparatus for forming shallow p-n junctions in silicon substrates to enable production of solar cells having shallow photovoltaic junctions, said apparatus comprising:

a first processing chamber;

means for delivering a plurality of said silicon substrates into said first processing chamber, said substrates each having a front surface and a back surface, and said substrates being of a first conductivity type;

an ultrasonic spray device for spray coating each of said front surfaces of each of said substrates with a liquid dopant-containing material so as to form on each of said front surfaces a layer of said liquid dopant-containing source material having a thickness substantially less than that of the substrates, said dopant being of a second, opposite conductivity type;

means for removing said substrates from said first processing chamber and delivering said substrates to a second processing chamber;

means for drying said layers in said second processing chamber so as to leave a dopant-containing residue on said front surfaces and delivering said substrates to a firing chamber; and means for firing said substrates in said firing chamber in an oxygen-containing environment so as to cause diffusion of said dopant from said residues into said substrates so as to provide in each of said substrates a region of said second, opposite conductivity type and a p-n junction adjacent said front surface.

15. Apparatus for forming p-n junctions in silicon substrates to provide silicon photovoltaic cells, each substrate being of a first conducting type and having a front surface and a back surface, said apparatus comprising:

walls defining a first housing;

first conveyor means movable into, through, and out of said first housing, for supporting said substrates on said back surfaces;

a spray device disposed in said first housing for spray coating said front surface of each of said substrates with a liquid material having as a constituent a dopant of a second and opposite conductivity type, as said substrates move on said first conveyor means through said first housing;

firing means disposed in a second housing for heating said substrates as said substrates move on second conveyor means through said second housing;

air conduits in communication with said first housing for admitting air thereinto; and humidity sensor means disposed in said first housing for providing signals to a control means for control of flow of moisturizing air through said air conduits in said first housing, such that said spray device is operative in a selectable air relative humidity.

16. The apparatus in accordance with claim 15 wherein said apparatus further comprises exhaust means in communication with said first housing to draw therefrom excess of said liquid material and air provided by said spray device and said air conduits.

17. The apparatus in accordance with claim 15 wherein said spray device is an ultrasonic spray device.

18. Apparatus for forming shallow p-n junctions in silicon substrates for production of solar cells having shallow photovoltaic junctions, said apparatus comprising:

a first processing chamber;

means for delivering a plurality of said silicon substrates into said first processing chamber, said substrates each having a front surface and a back surface, said substrates being of a first conductivity type;

an ultrasonic spray device disposed in said first processing chamber for spray coating each of said front surfaces of each of said substrates with a liquid dopant-containing material emitted in the form of a fog comprising micron-sized drops, so as to form on each of said front surfaces a layer of said liquid dopant-containing source material having a uniform thickness of about 0.1–0.2 microns, said dopant being of a second, opposite conductivity type;

a second processing chamber;

means for removing said substrates from said first processing chamber and delivering said substrates to a second processing chamber;

means disposed in said second processing chamber for drying said layers so as to leave a dopant-containing residue on said front surfaces;

a firing chamber;

means for delivering said substrates to said firing chamber; and means disposed in said firing chamber for firing said substrates in an oxygen-containing environment to cause diffusion of said dopant from said residues into said substrates to provide in each of said substrates a region of said second, opposite conductivity type and a p-n junction spaced from said front surface by about 0.5 micron and a coating thickness of less than said uniform thickness of coating applied by said spray device.

* * * * *